(12) United States Patent
Vohrer

(10) Patent No.: US 7,444,250 B2
(45) Date of Patent: Oct. 28, 2008

(54) MEASURING OR TEST DEVICE COMPRISING INTERCHANGEABLE FUNCTIONAL UNITS

(75) Inventor: Michael Vohrer, Ottenhofen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 178 days.

(21) Appl. No.: 10/569,326

(22) PCT Filed: Jul. 29, 2004

(86) PCT No.: PCT/EP2004/008536

§ 371 (c)(1),
(2), (4) Date: Feb. 17, 2006

(87) PCT Pub. No.: WO2005/019847

PCT Pub. Date: Mar. 3, 2005

(65) Prior Publication Data

US 2007/0021934 A1     Jan. 25, 2007

(30) Foreign Application Priority Data

Aug. 18, 2003   (DE) ................... 103 37 913

(51) Int. Cl.
    G01R 23/00      (2006.01)
    G06F 19/00      (2006.01)
(52) U.S. Cl. ........................................ 702/76
(58) Field of Classification Search ............ 702/57, 702/76, 76.19
    See application file for complete search history.

(56) References Cited

U.S. PATENT DOCUMENTS

| | | | |
|---|---|---|---|
| 5,059,892 A | 10/1991 | Stoft | |
| 5,566,088 A * | 10/1996 | Herscher et al. | ............. 702/123 |
| 6,112,067 A | 8/2000 | Seike | |
| 6,496,134 B1 * | 12/2002 | Asahina | ..................... 341/155 |
| 2002/0130255 A1 * | 9/2002 | Baney et al. | ........... 250/227.19 |
| 2002/0147554 A1 | 10/2002 | Pickerd | |

FOREIGN PATENT DOCUMENTS

| | | |
|---|---|---|
| DE | 2544329 | 4/1977 |
| DE | 4203819 | 8/1992 |
| DE | 10124371 | 11/2002 |
| EP | 0689306 A2 | 12/1995 |
| WO | WO 02/95426 | 4/2002 |
| WO | PCT/EP2004/008536 | 8/2006 |

OTHER PUBLICATIONS

Reliable RF testing of GSM, GPRS and EDGE mobile phones, PABST,News from Rohde & Schwarz, , 2002, 174, Rohde & Schwarz, Germany.
Die Ganze Elektronik, Burklin, Nov. 2001, 1109-1111, Germany.

* cited by examiner

Primary Examiner—Michael P. Nghiem
Assistant Examiner—Cindy H Khuu
(74) Attorney, Agent, or Firm—Ditthavong Mori & Steiner, P.C.

(57) ABSTRACT

A measuring device or test device is provided which includes several functional units that are interconnected. The functional units are interchangeable or can be added or omitted in a variable manner. The measuring or test device can be configured with functional units whose functional characteristics differ in terms of precision and/or quality and/or functional scope.

17 Claims, 3 Drawing Sheets

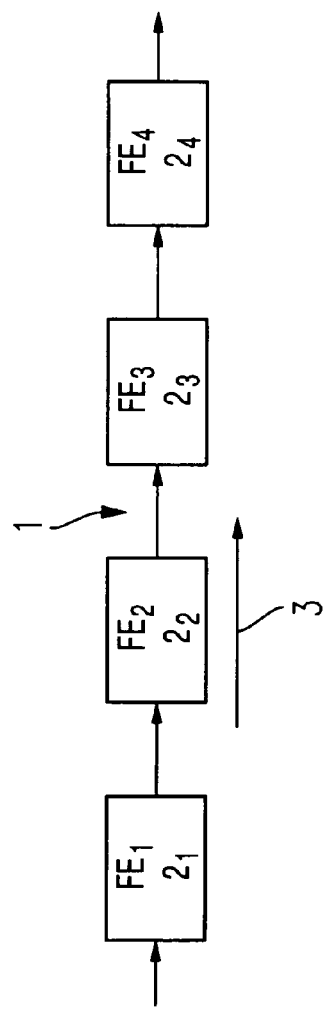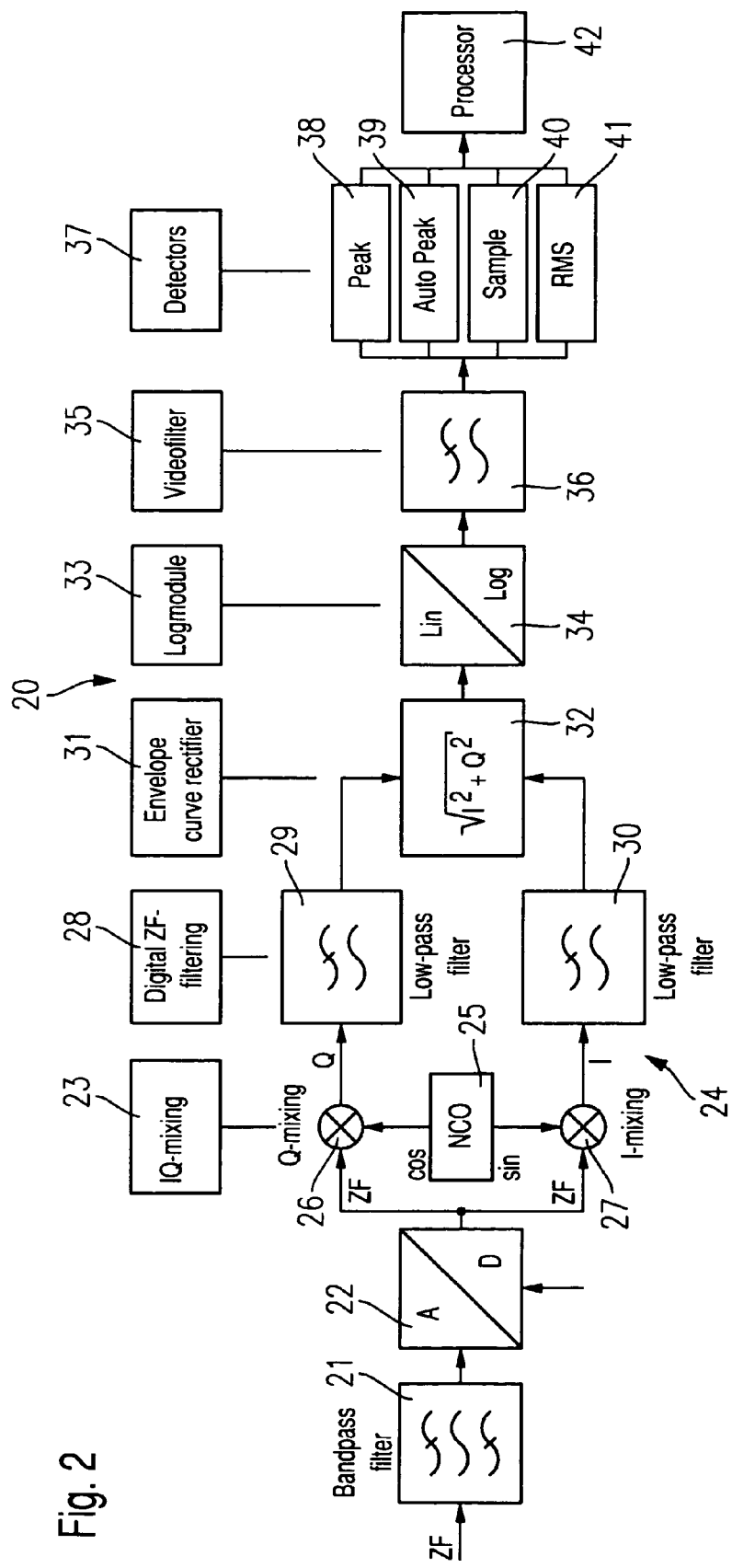

MEASURING OR TEST DEVICE COMPRISING INTERCHANGEABLE FUNCTIONAL UNITS

FIELD OF THE INVENTION

The invention relates to a measuring or testing device with several replaceable functional units.

BACKGROUND OF THE INVENTION

A measuring or testing device in the form of a signal generator with several functional units, which can be connected to one another in a variable manner is described, for example, in published German Patent Application No. DE 101 24 371 A1.

Conventionally, measuring or testing devices of a given type (for example, signal generators, spectrum analyzers, network channel analyzers etc.) have been characterized by a different performance dependent upon their equipment package, wherein all of the measuring properties are almost always designed to be of a corresponding, relatively high quality or relatively basic quality at the same time. However, in many cases, only one or a few high-quality properties are required for a given application, wherein other properties can be designed to be considerably more basic. Hitherto, the user has been obliged to purchase a measuring or testing device with a high overall performance, even if the high performance of only a few special measuring properties has been exploited. This has been relatively uneconomical for the user.

SUMMARY OF THE INVENTION

Therefore, in accordance with one aspect of the present invention, in one embodiment, a measuring or testing device is provided which guarantees an individual design of the performance of different measuring or testing properties.

In accordance with one aspect of the present invention, in one embodiment, the functional units are replaceable and/or can be added or omitted, wherein the measuring or testing device is configurable with functional units, of which the functional properties provide a different accuracy and/or a different quality and/or a different functional scope.

Examples of the different functional properties are the frequency range, display variants, noise-to-signal ratio, dynamic range, measuring rate, measurement resolution, measuring accuracy and input sensitivity of the individual functional units.

For example, for a research and development application, the functional properties can be characterized by a high dynamic response and high accuracy but with a relatively slow measuring rate, because, in research and development, accuracy plays a considerably greater role than the rate of measurement.

Conversely, for a production application, the functional properties may be characterized by a limited dynamic response, moderate accuracy but with a fast measuring rate, because the rate of measurement plays an extremely important role in production.

For a service application in repair workshops, only a limited dynamic response and limited accuracy is generally needed for almost all functional properties, that is to say, for almost all functional units. However, for certain special measurements, some of the functional units can be designed, for example, with greater accuracy.

Conversely, the measuring device can also be designed with the high-performance for only some or a few special measurements, while other measuring options, which are not needed for the measuring task, can be dispensed with.

Some advantages of certain aspects of the invention are based upon a maximally-optimized design of the measuring or testing device for the respective application, wherein the user can optimize the design of a measuring or testing device purchased at the time of purchasing the measuring or testing device. In this context, cost-intensive measuring functions with a high level of performance, which the user does not require at all, can be avoided.

Accordingly, a testing device can be offered as a platform, wherein the decisive functional units and/or measuring modules are available in at least two, but generally in a plurality of embodiments with different performance, so that the user can configure the measuring or testing device with the optimum suitability for the measuring tasks needed. Moreover, at a later time, the measuring or testing device can be adapted for a different application with different needs by "retrofitting" one or more functional units within a modular system. Functional units can be retrofitted even if these become available only at a later time.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Exemplary embodiments of the invention are described in greater detail below with reference to the drawings. The drawings are as follows:

FIG. 1 shows a general exemplary embodiment of a measuring or testing device consistent with the invention;

FIG. 2 shows a first concrete exemplary embodiment of a measuring or testing device consistent with the invention as a spectrum analyzer;

DETAILED DESCRIPTION OF THE PREFERRED EMBODIMENT

FIG. 1 shows an abstract presentation of a measuring or testing device 1 consistent with the invention. The illustrated measuring or testing device 1 includes several interconnected functional units $2_1$, $2_2$, $2_3$ and $2_4$, which, in the example presented, are connected in series along a signal path 3. However, as shown clearly in the subsequent, concrete exemplary embodiments, a parallel or independent interconnection of the functional units is also possible.

One difference by comparison with conventional measuring or testing devices is that, with the measuring or testing device 1 described herein, the functional units $2_1$, $2_2$, $2_3$, $2_4$ are replaceable and/or the functional units $2_1$, $2_2$, $2_3$, $2_4$ can be added or omitted. In this context, the measuring or testing device 1 may be configurable with different functional units, of which the functional properties, indicated in FIG. 1 by the reference numbers $FE_1$, $FE_2$, $FE_3$, $FE_4$, provide a different accuracy and/or a different quality and/or a different functional scope.

As a result, the measuring or testing device 1 is differently configurable for different tasks, for example, in research and development applications, in production applications or in service applications, as appropriate for the different needs of the different tasks.

Figure 3:
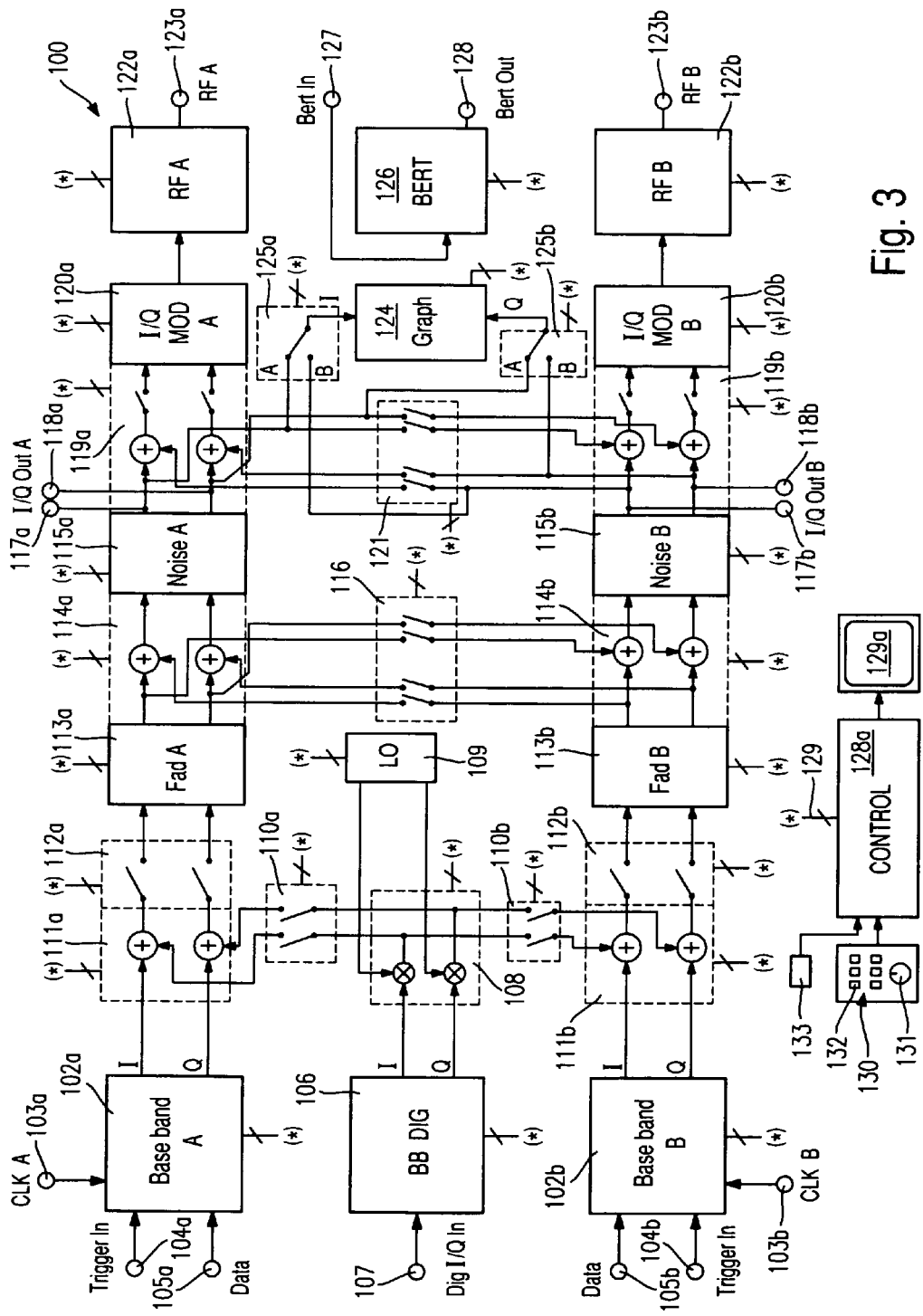
FIG. 3 shows a second concrete exemplary embodiment of a measuring or testing device consistent with the invention as a signal generator.
Figure 4:
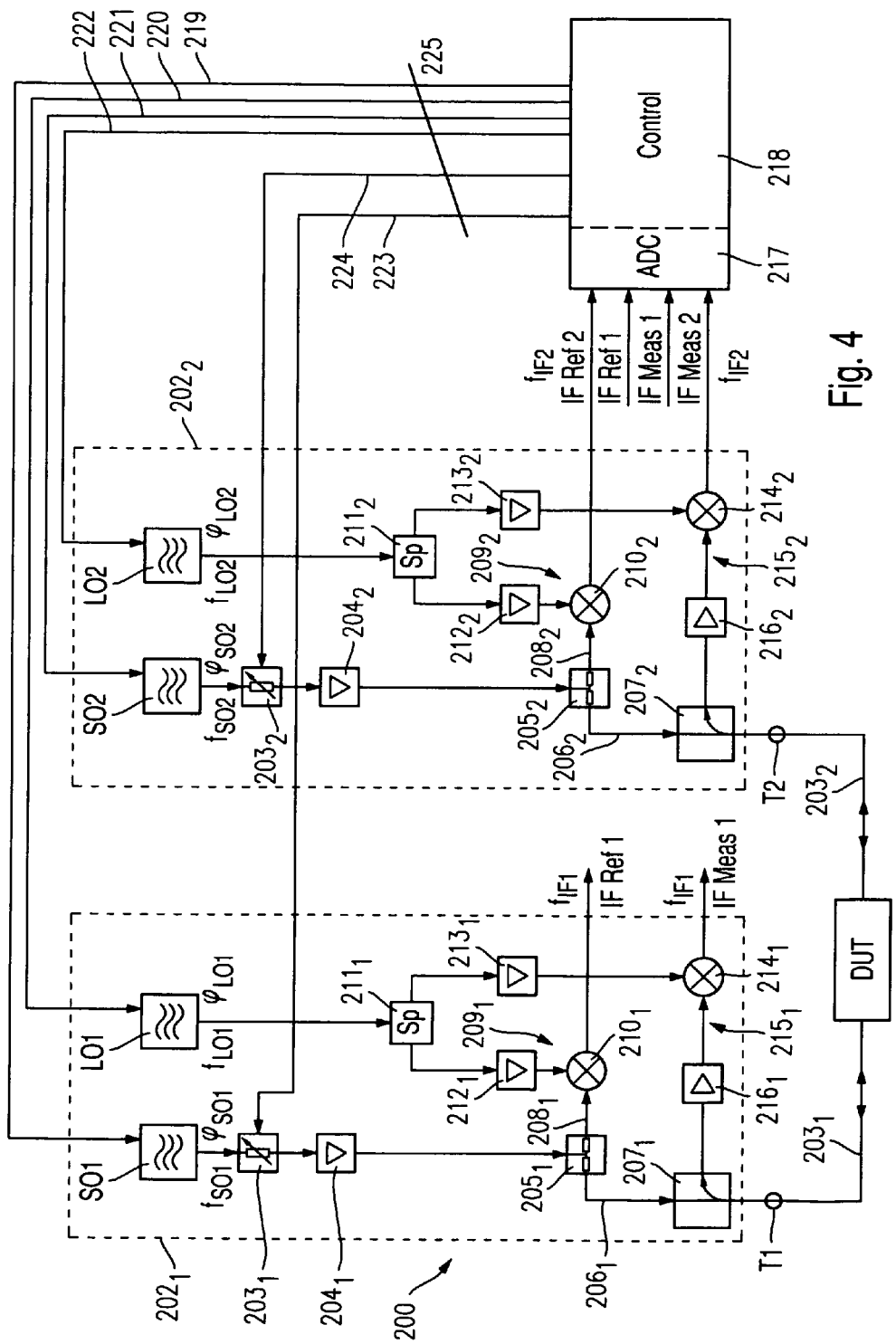
FIG. 4 shows a third concrete exemplary embodiment of a measuring or testing device consistent with the invention as a network channel analyzer.

By way of further explanation, three examples are described, namely, a spectrum analyzer as illustrated in FIG. 2, a signal generator, as illustrated in FIG. 3, and a network analyzer, as illustrated in FIG. 4.

FIG. 2 shows the measuring or testing device 1 as a spectrum analyzer 20. FIG. 2 only refers to the primarily-relevant signal range below the intermediate-frequency level.

The intermediate-frequency signal, indicated with the reference ZF, is filtered in a bandpass filter 21. This bandpass filter 21 can be a first replaceable functional unit, wherein the functional properties in this context can be the bandwidth and/or the noise-to-signal ratio of the signal and/or the linear dynamic range and/or the input sensitivity. The bandpass filter 21 is connected to an analog-digital converter 22. This analog-digital converter 22 is another replaceable functional unit with functional properties characterized by the dynamic range and/or the converter rate and/or the resolution and/or the accuracy.

This is followed by the I/Q mixing 23 in an I/Q demodulator 24, which conventionally includes a local oscillator 25 with two outputs with a 90° phase displacement, which together with the filtered and analog-digital-converted intermediate-frequency signals are supplied respectively to a mixer 27 of the I branch and a mixer 26 of the Q branch. This I/Q demodulator 24 represents a further replaceable functional unit, which is available with different bandwidth and/or different linear dynamic range and/or different I/Q imbalance etc., and can be incorporated with a different quality dependent upon the requirements for the quality of signal processing.

This is followed by the digital IF filtering 28 with two low-pass filters 29, 30, which can also be designed as replaceable, variable functional units, wherein the edge steepness of the low-pass filter and the aliasing-free, useful frequency range can characterize the functional properties in this context.

The envelope-curve rectification 31 takes place after this in an envelope-curve rectifier 32, which represents a further replaceable functional unit. The logarithm formation 33 takes place in a log module 34, which represents another replaceable functional unit with different functional properties. The log module 34 is followed by a video filter 36, in which the video filtering 35 takes place. The video filter 36 represents the next replaceable functional unit.

Finally, different detectors 38 to 41, for example, a peak detector 38, an auto-peak detector 39, a sample detector 40 and an RMS (Route Mean Square) detector are provided for the detection 37. Dependent upon needs, either all four detectors are incorporated with a high-performance spectrum analyzer 20, or only certain detectors, for example, with specialized measuring tasks, only a single detector, may be incorporated, thereby creating a spectrum analyzer for a special application.

Evaluation and control are implemented via a microprocessor 42, which can also be formed as a replaceable functional unit, wherein different processors with different computational rates, different cache memories etc. can be used dependent upon the performance of the spectrum analyzer 20.

FIG. 3 shows another exemplary embodiment, wherein the measuring and testing device in this context is provided in the form of a signal generator 100.

The signal generator 100 in the exemplary embodiment shown comprises a first baseband unit 102a and a second baseband unit 102b. Its structure is described in DE 101 24 371 A1.

At their I and Q outputs, the baseband units 102a and 102b generate baseband signals according to specified standards, which can be selected by the user, for example according to the GSM standard, the GSM EDGE standard or a wideband CDMA standard. The baseband units 102a, 102b can be supplied respectively with clock signals at ports 103a or 103b, with trigger signals at ports 104a or 104b and with modulation data at ports 105a and/or 105b. A digital baseband generator unit 106, which generates the I and Q components of a further baseband signal from the digital I/Q values supplied to a port 107, is additionally provided in the exemplary embodiment shown. The output signal of the digital baseband generator 106 can be multiplied in a multiplier unit 108, to which the constant frequency of an adjustable local oscillator 109 is supplied.

The optionally upwardly-mixed baseband signal of the digital baseband generator unit 106 is supplied via a switching unit 110a or respectively a second switching unit 110b to a digital adder 111a or respectively a digital adder 111b.

The output signal of the baseband units 102a and 102b or respectively of the adders 111a and 111b is supplied via a switching unit 112a or respectively 112b to a fading unit 113a or respectively 113b, which provides the baseband signal with a fading (variable fading). The functions of the fading units 113a and 113b, for example, the number, the time delay and the attenuation of the signal delay paths implemented in the fading unit, can be set by the user. The fading units 113a and 113b are connected respectively via an adder 114a or respectively 114b to a noise unit 115a or respectively 115b. The noise units 115a, 115b provide the baseband signal with a noise signal which can be specified by the user, wherein, for example, the noise type and the level of the noise signal generated by the noise unit 115a, 115b can be selected by the user. The output signals of the fading units 113a, 113b can also be added, via a switching unit 116 connecting the adders 114a and 114b, instead of via a separate connection of the respective fading unit 113a or respectively 113b, to the assigned noise unit 115a or respectively 115b, and supplied to one of the two noise units 115a or respectively 115b. The I/Q output signals at the output of the noise units 115a or respectively 115b can be de-coupled at the ports 117a and 118a or respectively 117b and 118b.

The output signals of the noise units 117a and 117b can be supplied to I/Q modulators 120a or respectively 120b via addition and switching units 119a and 119b. Here also, the output signals of the noise units 115a and 115b can be added via a switching unit 121 and supplied to one of the two I/Q modulators 120a or respectively 120b. Several user-specific selection options are also available with regard to the function of the I/Q modulator 120a, 120b. For example, the I/Q modulator 120a, 120b can be operated in such a manner that it generates a burst sequence and the active bursts or the level of the active bursts can be selected by the user.

The I/Q modulators 120a and 120b are each connected to a high-frequency unit 122a or respectively 122b, and the high-frequency signal can be picked up at a port 123a and/or 123b. For example, the output frequency or several output frequencies initiated in the sudden-frequency change process of the high-frequency units 122a and 122b can be selected by the user.

A signal display 124, which, in the exemplary embodiment shown, can be connected via the switching units 125a or respectively 125b to the output of the noise unit 115a or the noise unit 115b, is additionally provided. Alternatively, a connection of the display device 124 directly to the outputs of the baseband units 102a and 102b is also conceivable. The signal display 124 allows, for example, a presentation of the configuration diagram, so that the user can check the method of operation of the connected signal path.

Furthermore, a bit-error rate tester (BERT=Bit Error Rate Tester) 126 is provided, at the input port 127 of which a signal of the device under test (DUT) can be supplied, wherein the bit-error rate of the signal can be picked up at the output port 128.

Additional functional units can also be present, and further combination variants of the functional units, which are not presented here for reasons of logical presentation, may also be possible.

All of the functional units 102a, 102b, 106, 108, 109, 110a, 110b, 111a, 111b, 112a, 112b, 113a, 113b, 114a, 114b, 115a, 115b, 116, 119a, 119b, 120a, 120b, 121, 122a, 122b, 124 and 126 are connected to a control device 128a, for example, a CPU, via a control bus 129, of which the connection to the functional units is marked with the symbol (*). The control unit 128a controls the interconnection and function of the individual functional units required by the user. The current interconnection of the functional units is displayed on a display device (display) 129a, which can be disposed, together with the control elements 130, on the front panel of the signal generator 100. For this purpose, a graphic functional block is assigned to each of the functional units, and the connection of the functional units is displayed on the display device 129 by means of corresponding connecting elements, which connect the functional blocks to one another. The connections of the functional blocks and the functions of the functional blocks are selected either by means of a rotary knob 131 and/or corresponding operating keys 132 or via a movable positioning element 133 (mouse).

With the signal generator 100 described above, advantageously, the functional units are replaceable and/or can be added and omitted in a variable manner, so that the signal generator 100 is configurable with a different performance, the performance being dependent upon the functional properties of the functional units.

For example, the functional properties of the baseband units 102a, 102b are characterized by the number of codable standards, e.g. GSM, EDGE, W-CDMA, COFDM for wireless LAN etc.

The functional properties of the fading units 113a, 113b can be characterized by the number of delay channels, wherein each delay channel creates an additional memory requirement and therefore causes additional costs. Dependent upon the performance needed, a fading unit with a different number of delay channels can be used in the signal generator 100.

The functional property of the noise units 117a, 117b can be characterized by the number of emulatable noise types (thermal noise, white noise, 1/f noise etc.).

The functional properties of the I/Q modulators 120a, 120b can be characterized by the bandwidth and/or the linear dynamic range and/or the I/Q imbalance and other parameters characterizing the quality of the I/Q modulators.

The functional properties of the high-frequency units 122a, 122b can be characterized by the bandwidth and/or the linear dynamic range and/or the output power.

FIG. 4 shows a further exemplary embodiment of a measuring device 1 according to the invention. In the exemplary embodiment illustrated, the measuring device 1 is a vector network analyzer 200. The exemplary embodiment illustrated is a 2-port-network channel analyzer. In the context of vectorial network channel analyzers, the concept as discussed herein is not limited to 2-port-network channel analyzers; on the contrary, it is particularly suitable for multi-port network channel analyzers with more than two measurement ports.

A separate excitation/receiver unit $202_1$ and respectively $202_2$ is provided at each port T1, T2 of the network channel analyzer. Each excitation/receiver unit $202_1$ and/or $202_2$ has at its disposal a signal generator SO1 and/or SO2, with which the device under test DUT can be supplied with an excitation signal. Only one of the two signal generators SO1 or SO2 may be active, or both of the signal generators SO1 and respectively SO2 can produce an excitation signal.

In the application presented, the device under test is a 2-port device, for example, a bandpass filter, an amplifier, an attenuation circuit or similar. Each of the two ports of the device under test DUT is connected via a measuring line $203_1$ and/or $203_2$ to one of the two ports T1 or T2 of the network channel analyzer 200.

The signal generators SO1 and SO2 are each connected via a variable attenuation element $203_1$ and $203_2$ and respective amplifier $204_1$ and $204_2$ to a signal distributor (signal splitter) $205_1$ and respectively $205_2$. One signal branch $206_1$ or respectively $206_2$ is connected via a respective bridge (directional coupler) $207_1$ or respectively $207_2$ to the assigned port T1 or T2. The other branch $208_1$ or respectively $208_2$ is connected to a mixer $210_1$ or respectively $210_2$ of a first receiver device $209_1$ or respectively $209_2$ of the respective excitation/receiver unit $202_1$ or respectively $202_2$. The first receiver device $209_1$ or respectively $209_2$ therefore receives the excitation signal, whenever the associated signal generator SO1 or SO2 is active. Furthermore, an oscillator signal, which is generated by an internal oscillator LO1 or respectively LO2 of the respective excitation/receiver unit $202_1$ or respectively $202_2$ and supplied to the mixer $210_1$ or respectively $210_2$ via a signal distributor (signal splitter) $211_1$ or $211_2$ and an amplifier $212_1$ or respectively $212_2$, is supplied to the mixer $210_1$ or respectively $210_2$.

Via the other signal branch of the signal splitters $211_1$ and/or $211_2$ and a corresponding amplifier $213_1$ or respectively $213_2$, the same oscillator LO1 or LO2 supplies a mixer $214_1$ and/or $214_2$ of a second receiver device $215_1$ or respectively $215_2$ of the respective excitation/receiver unit $202_1$ or respectively $202_2$. The mixer $214_1$ or respectively $214_2$ is connected via an isolation amplifier $216_1$ or respectively $216_2$ and the bridge $207_1$ and/or $207_2$ to the assigned port T1 and/or T2. Accordingly, the second receiver device $215_1$ receives the signal received from the associated port T1, reflected from the device under test to the port T1 or transmitted by the device under test DUT from the port T1 to the port T2. The second receiver device $215_2$ of the excitation/receiver unit $202_2$ receives the signal reflected from the device under test DUT to the port T2 or transmitted via the device under test DUT from the port T1 to the port T2. The mixers $210_1$ and $214_1$ of the first excitation/receiver unit $202_1$ convert the received signal into a first intermediate-frequency position with the intermediate frequency $f_{IF1}$, while the mixers $210_2$ and $214_2$ of the excitation/receiver device $202_2$ convert the received signal into a second intermediate-frequency position with the intermediate frequency $f_{IF2}$. In this context, the intermediate frequencies $f_{IF1}$ and $f_{IF2}$ are not necessarily identical.

The intermediate-frequency reference signal IF Ref 1 or respectively IF Ref 2 generated by the mixers $210_1$ or respectively $210_2$ and the intermediate frequency measured signal IF Meas 1 or respectively IF Meas 2 generated by the mixers $214_1$ or respectively $214_2$ is supplied to an analog-digital converter 217, which is connected to a signal evaluation and control unit 218, in which an evaluation of the reference signals and the measured signals is carried out. Furthermore, via the control lines 219, 220, 221 and 222, the signal evaluation and control unit 218 controls the signal generators SO1 and SO2 and the oscillators LO0 and LO2 in such a manner that these generate a signal with predetermined frequency $f_{SO1}$, $f_{LO1}$, $f_{SO2}$ and/or $f_{LO2}$ and with predetermined phase $\phi_{SO1}$, $\phi_{LO1}$, $\phi_{SO2}$ and $\phi_{LO2}$.

The evaluation and control unit 218 is connected via further control lines 223 and 224 to the adjustable attenuation elements $203_1$ and $203_2$, so that the signal amplitude of the excitation signal generated by the signal generators SO1 and SO2 is controllable. Since the actual amplitudes of the excitation signals are registered via the intermediate-frequency reference signal IF Ref 1 and IF Ref 2, a control loop can be formed in this manner for the accurate control of the excitation amplitude.

The control lines 219 to 223 can be combined to form a bus system 225, in particular, a LAN bus system.

In the case of the measuring device presented in FIG. 4 in the form of a network channel analyzer 200, the individual functional units are replaceable or can be added or omitted, wherein the network channel analyzer 200 is configurable with the functional units, of which the functional properties provide a different accuracy and/or a different quality and/or a different functional scope.

In the example of the network channel analyzer 200, the functional units consist of the different excitation/receiver units $202_1$ and/or $202_2$. The number of fitted excitation/receiver units, which is determined by the number of ports of the network channel analyzer 200, is initially flexible. If only 2-port devices under test are to be tested, (for example, amplifiers, attenuation elements, lines etc.), a 2-port network analyzer is sufficient. If this network channel analyzer were to be used, for example, in production, and always the same 2-port devices under test were to be tested, it would be pointless to equip the network analyzer with more than two excitation/receiver units. However, with a different measuring task, it is entirely possible that multi-port devices under test, for example, crossover networks, directional couplers etc. may have to be measured. Only then would it be meaningful to fit the network channel analyzer with additional excitation/receiver units. In the case of a device, which is to be used in the research and development sector, it may be meaningful to fit the network channel analyzer from the start with as many excitation/receiver units as possible, so that multi-port devices under test can also be measured.

Another exemplary freedom of variation is provided by the sweep bandwidth, the linear dynamic range and/or the input sensitivity of the excitation/receiver units, that is to say, different excitation/receiver units can be offered, which provide a different performance, and, dependent upon the measurement task, several excitation/receiver units with different levels of performance can be combined. For example, if an amplifier is to be constantly excited with the same input signal at the same level, it would be pointless, to use an excitation/receiver unit with high dynamic response of the output level for this purpose. However, if the output of the same amplifier is to be measured, and if the amplification factor provides a significant frequency response, then it is important for the excitation/receiver unit, which is connected to the output of the amplifier to be measured, to provide a high input dynamic response and optionally a high input sensitivity.

The invention is not limited to the exemplary embodiments described above. On the contrary, these are provided merely in order to explain the invention. The invention can be used with a plurality of measuring and testing devices for different measurement tasks.

While the present invention has been described in connection with a number of embodiments and implementations, the present invention is not so limited but covers various obvious modifications and equivalent arrangements, which fall within the purview of the appended claims.

What is claimed is:

1. A device for measuring or testing, said device comprising:
 a plurality of functional units interconnected with one another to form a measuring or testing circuit,
 wherein at least two functional units of the plurality of functional units each have functional properties that provide for a different accuracy or a different quality as compared to the corresponding accuracy or the corresponding quality of the functional properties of the other of the at least two functional units,
 wherein the device is a spectrum analyzer, a network channel analyzer, or a signal generator,
 wherein the plurality of functional units are removable from said measuring or testing circuit in order to configure said measuring or testing circuit, and
 wherein the device is configured for a research and development application, such that the functional properties of at least one of the at least two functional units are characterized by a high dynamic response, high accuracy, and relatively slow measuring rate.

2. A device according to claim 1, wherein the functional properties are characterized by a frequency range, a signal-to-noise ratio, a dynamic range, a measuring rate, a measurement resolution, a measuring accuracy, or an input sensitivity.

3. A device according to claim 1, wherein the device is a spectrum analyzer, and wherein the plurality of functional units includes an intermediate-frequency filter, an analog-digital converter, an I/Q demodulator, an envelope-curve rectifier, a log module, a video filter, or at least one detector.

4. A device according to claim 3, wherein the plurality of functional units includes the intermediate-frequency filter, and wherein the functional properties of the intermediate-frequency filter are characterized by a bandwidth, a signal-to-noise ratio, a linear dynamic range, or an input sensitivity.

5. A device according to claim 3, wherein the plurality of functional units includes the analog-digital converter, and wherein the functional properties of the analog-digital converter are characterized by a dynamic range, a conversion rate, a resolution, or an accuracy.

6. A device according to claim 3, wherein the plurality of functional units includes the at least one detector, and wherein the functional properties of the at least one detector are characterized by a detector property, a dynamic range, a measuring rate, a measurement resolution, a measuring accuracy, or an input sensitivity.

7. A device according to claim 1, wherein the device is a signal generator, and wherein the plurality of functional units includes at least one baseband unit, at least one fading unit, at least one noise unit, at least one I/Q modulator, at least one high-frequency unit, or a display.

8. A device according to claim 7,
 wherein the plurality of functional units includes at least one fading unit; and
 wherein the functional properties of each fading unit are characterized by a number of delay channels.

9. A device according to claim 7,
 wherein the plurality of units includes at least one noise unit; and wherein the functional properties of each noise unit are characterized by a number of emulatable noise types.

10. A device according to claim 7, wherein the plurality of functional units includes the at least one I/Q modulator, and wherein the functional properties of each I/Q modulator are characterized by a bandwidth, a linear dynamic range, or an I/Q imbalance.

11. A device according to claim 7, wherein the plurality of functional units includes the at least one high-frequency unit, and wherein the functional properties of each high-frequency unit are characterized by a bandwidth, a linear dynamic range, or an output power.

12. A device according to claim 1, wherein the plurality of functional units includes the at least one baseband unit, and wherein the functional properties of each baseband unit are characterized by a number of codable standards.

13. A device according to claim 1, wherein the device is a network channel analyzer, and wherein the plurality of functional units includes a plurality of excitation and receiver units.

14. A device according to claim 13, wherein the functional properties of each excitation and receiver unit are characterized by a sweep bandwidth, a linear dynamic range, or an input sensitivity.

15. A device for measuring or testing, said device comprising:
a plurality of functional units interconnected with one another to form a measuring or testing circuit,
wherein at least two functional units of the plurality of functional units each have functional properties that provide for a different accuracy or a different quality as compared to the corresponding accuracy or the corresponding quality of the functional properties of the other of the at least two functional units,
wherein the device is a spectrum analyzer, a network channel analyzer, or a signal generator,
wherein the plurality of functional units are removable from said measuring or testing circuit in order to configure said measuring or testing circuit, and
wherein the device is configured for a production application, such that the functional properties of at least one of the at least two functional units are characterized by a limited dynamic response, moderate accuracy, and a fast measuring rate.

16. A device for measuring or testing, said device comprising:
a plurality of functional units interconnected with one another to form a measuring or testing circuit,
wherein at least two functional units of the plurality of functional units each have functional properties that provide for a different accuracy or a different quality as compared to the corresponding accuracy or the corresponding quality of the functional properties of the other of the at least two functional units,
wherein the device is a spectrum analyzer, a network channel analyzer, or a signal generator,
wherein the plurality of functional units are removable from said measuring or testing circuit in order to configure said measuring or testing circuit, and
wherein the device is configured for a service application, such that the functional properties of a large proportion of the plurality of functional units are characterized by a limited dynamic response and limited accuracy, and the functional properties of a small proportion of the plurality of functional units are characterized by a relatively high dynamic response and high accuracy.

17. A device for measuring or testing, said device comprising:
a plurality of functional units interconnected with one another to form a measuring or testing circuit,
wherein at least two functional units of the plurality of functional units each have functional properties that provide for a different accuracy or a different quality as compared to the corresponding accuracy or the corresponding quality of the functional properties of the other of the at least two functional units,
wherein the device is a spectrum analyzer, a network channel analyzer, or a signal generator,
wherein the plurality of functional units are removable from said measuring or testing circuit in order to configure said measuring or testing circuit,
wherein the plurality of functional units includes the I/Q demodulator, and wherein the functional properties of the I/Q demodulator are characterized by a bandwidth, a linear dynamic range, or an I/Q imbalance.

* * * * *